Aug. 2, 1966 V. L. NEWHOUSE 3,264,578

NEGATIVE IMPEDANCE SUPERCONDUCTING OSCILLATOR

Filed Dec. 16, 1963

Inventor:
Vernon L. Newhouse,
by John P. Dellett
His Attorney.

3,264,578
Patented August 2, 1966

1 2

3,264,578
NEGATIVE IMPEDANCE SUPERCONDUCTING OSCILLATOR

Vernon L. Newhouse, Scotia, N.Y., assignor to General Electric Company, a corporation of New York Filed Dec. 16, 1963, Ser. No. 331,033
7 Claims. (Cl. 331—107)

Figure 1:
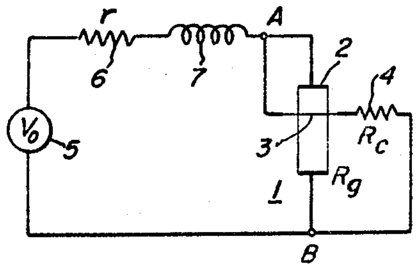

This invention relates to a superconducting oscillator and more particularly to such oscillator functioning in accordance with the characteristic of a negative impedance superconducting circuit.

Superconductivity is that property exhibited by certain metals of losing substantially all electrical resistance at low temperatures near absolute zero. Among such metals are niobium, lead, tantalum, tin, vanadium and mercury. A number of alloys and compounds also exhibit superconductive properties. As a conductor formed of one of these materials is lowered in temperature, the resistance drops more or less uniformly until a temperature is reached at which resistance suddenly disappears. This temperature is a property of the particular material and is called the critical temperature for the material. Below this temperature resistance may be restored by subjecting the conductor to a magnetic field in excess of a given value called the material's critical field. In addition, resistance may also be restored at temperatures below the critical temperature by means of passing a current through the conductor in excess of a designated critical current. The critical current re-establishes resistance in large part because of the magnetic field associated with the current.

Practical superconducting devices have been developed which enable operation of entire circuits at extremely low or superconducting temperatures, conventionally near the boiling temperature of liquid helium (4.2° Kelvin). Such circuitry is largely lossless, containing a majority of zero resistance components and interconnections; therefore the superconducting circuits and elements may be greatly miniaturized with many thousands accommodated per cubic foot. Thus far, most common superconducting circuits involve simple cryogenic switching elements. In these elements, called cryotrons, a current in a superconductor called a gate is effectively turned on and off by means of a closely proximate magnetic field. The magnetic field is generated with another superconductor called a grid-control or simply a grid. These switching elements, or cryotrons, may be assembled into a computing arrangement whereby a whole computer is accommodated in small volume.

A further advantage accrues in providing more complex circuitry at the superconducting level in order to more fully achieve circuit completeness and compactness, obviating a multiplicity of interconnections between the superconducting circuit and non-superconducting circuitry. The present invention relates to an improved superconducting negative impedance oscillator operable at superconducting temperatures. The device generates oscillatory wave forms in the superconducting environment.

Several superconducting oscillators have been described heretofore. A first example is the thermal oscillator wherein a particular superconductor repetitively exceeds its critical temperature and is then allowed to cool to its superconducting range. The periodicity of this oscillator is gauged by the superconductor's thermal time constant, or the time taken for cooling to a superconducting temperature. This type of oscillator is not well suited to high frequency oscillations because of the time consumed in the heat cycle. In addition the frequency of oscillation is to a great extent influenced by the heating and heat dissipating properties of the oscillator's environment, making the oscillation frequency somewhat unpredictable.

A second type of oscillator comprises a plurality of separate bistable circuits or flip-flops. Each bistable stage includes a pair of cryotron switching devices with cross-coupling therebetween, wherein only one cryotron gate of the pair is superconducting at any one time. An odd number of such stages greater than one are cascaded in a ring with the output of the last stage triggering the first. In this matter, a particular stage operates to change the state of the next, and at least one buffer stage completes the circular connection. This arrangement of course requires a comparatively large number of components as compared with the one-stage vacuum tube multivibrator, for example. Moreover, the oscillations produced are somewhat non-symmetrical and the frequency capability is inherently scaled down by a factor of at least three, inasmuch as at least three stages are required.

Other types of superconducting oscillators are known which may employ tuned circuitry. In one instance, an oscillatory tuned circuit is sustained at superconducting temperatures to maintain it lossless, while a feedback amplifier portion of the circuit is external to the superconducting environment. In general oscillators of this type tend to require extensive apparatus wherein the majority of the elements are non-superconducting.

In the copending application of William H. Meiklejohn, Serial No. 213,456, filed July 30, 1962, now Patent No. 3,188,579, and assigned to the assignee of the present invention, a superconducting relaxation oscillator is described and claimed representing an improvement over prior art oscillators. According to that invention, a single stage oscillator circuit is provided for use at superconducting temperatures. The Meiklejohn oscillator in general provides a pair of cross-coupled cryotrons with a bias source disposed across the grid of one of them. Unlike a conventional one-stage superconducting flip-flop, a current increase through the bias cryotron gate has the effect of rendering the same gate resistive, whereby the circuit is rendered unstable for the purpose of generating oscillations.

It is the purpose of the present invention to provide a simplified oscillator, of the negative impedance type, also useful in cryogenic environment. In accordance with the present invention, a single cryotron gate has coupled thereacross the cryotron's own grid in series with a resistance. This parallel combination will be seen to have a characteristic negative impedance. The parallel circuit is coupled to a source through circuitry having a high A.C. impedance, but a relatively low D.C. impedance, whereby operation of the parallel portion of the circuit is secured in its negative impedance operating region. The circuit coupling the negative impedance to the source preferably comprises an inductance and a resistance.

Figure 2:
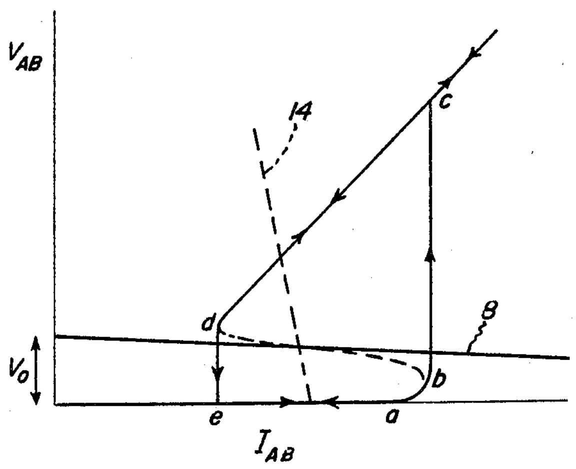
Figure 3:
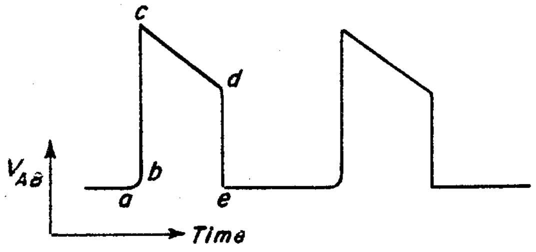
Figure 4:
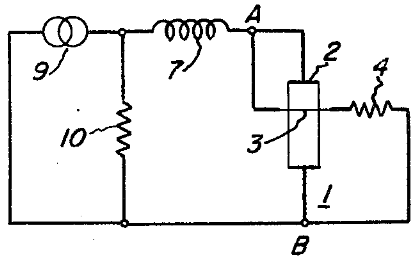
Figure 5:
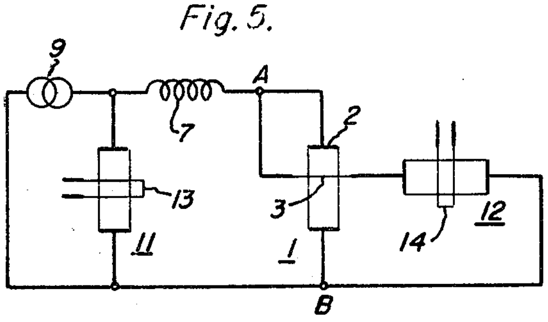

The subject matter which I regard as my invention is particularly pointed out and distinctly claimed in the concluding portion of this specification. The invention, however, both as to organization and method of operation, together with further objects and advantages thereof, may best be understood by reference to the following description taken in connection with the accompanying drawings wherein like reference characters refer to like elements and in which:

FIG. 1 is a schematic diagram of an explanatory circuit in accordance with the present invention, FIG. 2 is an operating characteristic curve of the negative impedance portion of the FIG. 1 circuit, FIG. 3 is an illustrative waveform for a circuit in accordance with the present invention, FIG. 4 is a schematic diagram of the circuit in accordance with the present invention, empowered by a current source, and FIG. 5 is a schematic diagram of another embodiment of the present invention employing adjustable cryotron resistances.

Referring to FIG. 1, an illustrative oscillator circuit in accordance with the present invention includes a cryotron 1 having a gate conductor 2 formed of "soft" superconducting material, e.g. tin, and a grid conductor 3 formed of "hard" superconducting material, for example, lead, or a similar material capable of retaining superconductivity while generating a magnetic field for driving the "soft" gate conductor normally resistive. The end terminals of the cryotron's gate are designated "A" and "B." The grid 3 in series with a resistor 4 is coupled across terminals A and B, that is in parallel with the gate, to form what will be termed a parallel negative impedance circuit. The resistor 4 has a value, $R_c$, comparable to $R_g$, the normal resistance of gate 2 and may be made conveniently equal thereto. A voltage source 5, which in accordance with known practice is a direct current source, supplies terminals A and B through an intervening series resistor 6 and inductance 7. The inductance is air wound of hard superconducting material and may have a typical value of 1000 microhenries. Resistor 6 may be, or may include, the source resistance but desirably has a value for attaining operation in the negative impedance operating region of the parallel negative impedance circuit, as will hereinafter become more evident. $400\mu$ ohms is a typical value. All interconnections are hard superconductor material and the entire circuit with the exception of the source is preferably maintained at a superconducting temperature for the materials used. The temperature of the liquid helium at a pressure reduced from atmospheric value is suitable, being slightly below the critical temperature for the tin soft superconducting material.

If voltage source 5 is disconnected and then a gradually increasing, and then decreasing current is passed between only terminals A and B, that is through the negative impedance parallel circuit, the voltage between A and B will vary as shown in FIG. 2. The resulting characteristic curve is analyzed as describing a negative impedance in the following manner. As the current increases from zero, gate 2 and grid 3 of the cryotron are both superconducting. A majority of the current will therefore flow through the gate which has much lower inductance being a wider conductor. As the current exceeds the critical value for the gate, gate resistance appears. A voltage, $V_{AB}$ then becomes finite as shown at segment *ab* in FIG. 2. More and more of the additional injected current is now diverted through the grid. Eventually at point *b* in FIG. 2 the increasing magnetic field of the grid produces a runaway increase in gate resistance, illustrated at *bc* in FIG. 2. This terminates with the gate normal and the injected current divided between gate and grid according to the relative values of $R_c$ and $R_g$. If the applied current is decreased, $V_{AB}$ varies along *cd* and finally jumps back to zero or a very low voltage value as shown by *de*.

If on the other hand, a voltage source is applied between terminals A and B in the above manner, the broken line *db* describes the smooth and reversible current variation obtained. This broken line portion of the characteristic is termed the negative impedance region inasmuch as current varies inversely with voltage therealong. The absolute value of this impedance, represented by the average slope of the broken portion *db* of the characteristic is typically about $200\mu$ ohms. The characteristic of FIG. 2 may be described as that of a short-circuit stable negative impedance. When driven through a high A.C. impedance, i.e. inductance 7 in FIG. 1, the parallel negative impedance circuit oscillates. In this case, *r*, the value of resistor 6, $V_0$, the value of the voltage from source 5, are adjusted so that the D.C. or static load line 8 in FIG. 2 passes through the dashed negative impedance portion *db* of the characteristic curve. The value of *r* for securing this load line is less than the normal resistance of the cryotron and less than the magnitude of the negative impedance represented by the broken portion *db* of the FIG. 2 characteristic. The circuit oscillates through values *a, b, c, d* and *e* of the FIG. 2 characteristic generating a waveform of the type shown in FIG. 3 wherein the plot of $V_{AB}$ with time is lettered to correspond to the similarly lettered points on the FIG. 2 characteristic curve. The inductance 7 has a value offering a high A.C. impedance to the negative impedance circuit compared to the cryotron's negative impedance represented at *db*, and the cryotrons normal resistance. It thus provides a nearly vertical A.C. load line 14 shown dashed in FIG. 2. The negative impedance, being short-circuit stable, oscillates when it sees a high impedance source means.

The complete oscillator circuit of FIG. 1 utilizes the FIG. 2 characteristic to produce the FIG. 3 waveform in the following manner. Assume that the circuit is resting for the moment between points *e* and *a* of FIG. 2. The current through inductance 7 and resistance 6 will increase with the time constant $L/r$, where L is the inductance of coil 7 and *r* is the resistance of resistor 6. At point *b*, $V_{AB}$ will snap to its maximum value with a speed depending upon the grid inductance, the gate resistance, $R_g$, and the resistance of resistor 4, $R_c$. During this time interval, which will be very short, the current through inductance 7 must remain approximately constant since the current through an inductance cannot change rapidly. $V_{AB}$ now exceeds $V_0$. Consequently the current through inductance 7 decreases with a time constant $L/(r+R)$, where $$\frac{1}{R}=\frac{1}{R_c}+\frac{1}{R_g}$$

Finally, $V_{AB}$ collapses at point *d* and the cycle repeats itself. If L is made smaller so that $L/R$ is comparable to the grid inductance divided by the gate resistance, the oscillations shown in FIG. 3 will reduce in amplitude and tend towards the form of a sine wave.

In practice, cryotron circuits are more conveniently driven by a current source rather than a voltage source. This leads to the practical oscillators of FIGS. 4 and 5. The construction and operation of these circuits is identical as regards like reference numerals referring to like components, and will not be redescribed in detail. In FIG. 4, the voltage source 5 and series resistance 6 in FIG. 1 are replaced by an equivalent direct current source 9 and parallel resistor 10 in the manner well known to those skilled in the art.

In the practical oscillator circuit of FIG. 5 resistor 10 is replaced by cryotron 11 and resistor 4 is replaced by a cryotron 12. These changes provide certain advantages and further adapt the circuit to operation at superconducting temperatures in realizing these advantages. Since the resistance of cryotrons 11 and 12 is conveniently controllable by means of control current in the respective grids 13 and 14, the circuit constants are readily adjustable from outside the cryogenic environment. The frequency of oscillation is readily controlled by varying *r* and $R_c$, the resistance of cryotrons 11 and 12 respectively. Reducing the value of either resistance to zero completely quenches circuit oscillation.

While I have shown and described several embodiments of my invention, it will be apparent to those skilled in the art that many changes and modifications may be made without departing from my invention in its broader aspects; and I therefore intend the appended claims to cover all such changes and modifications as fall within the true spirit and scope of my invention.

What I claim as new and desire to secure by Letters Patent of the United States is:

1. A cryogenic circuit having a negative impedance including a cryotron having a gate of soft superconducting material, the resistance of which is restored by a first critical magnetic field, a grid superposed with respect to said gate for providing a magnetic field in excess of said critical field, the grid being formed of hard superconducting material having a critical field higher than said first mentioned critical field, means including a resistance in series with said grid electrically coupling said grid in parallel circuit relation with said gate, and source means coupled across said gate including inductive means to provide a high A.C. impedance compared to the value of impedance of said negative impedance.

2. A cryogenic oscillator comprising a cryotron having a gate of soft superconducting material, the resistance of which is restored by a first critical magnetic field, cryotron terminals coupled to either end of said gate, a grid superposed with respect to said gate for providing a magnetic field in excess of said critical field, the grid being formed of hard superconducting material having a critical field higher than said first mentioned critical field, means including a resistance in series with said grid for electrically coupling said grid in parallel circuit relation with said gate, terminals for connection to a power supply, and an inductance and an effective series resistance coupling said power supply terminals to said cryotron terminals.

3. A cryogenic oscillator comprising: a negative impedance parallel circuit including a cryotron having a gate of soft superconducting material, the resistance of which is restored by a first critical magnetic field, cryotron terminals coupled to either end of said gate, a grid superposed with respect to said gate for providing a magnetic field in excess of said critical field, the grid being formed of hard superconducting material having a critical field higher than said first mentioned critical field, and means including a resistance in series with said grid for electrically coupling said grid in parallel circuit relation with said gate; terminals for connection to a power supply; and an inductance and an effective series resistance coupling said power supply terminals to said cryotron terminals; said inductance being formed as an air wound superconductor having an effective A.C. impedance which is high as compared to the normal resistance of said cryotron; and said effective series resistance having a value less than the normal resistance of said cryotron for establishing a D.C. load line securing operation of said parallel circuit in its characteristic region of negative impedance.

4. The oscillator according to claim 3 wherein the resistance in series with said cryotron grid approximates the normal resistance value of said gate.

5. A cryogenic oscillator comprising a cryotron having a gate of soft superconducting material, the resistance of which is restored by a first critical magnetic field, cryotron terminals coupled to either end of said gate, a grid superposed with respect to said gate for providing a magnetic field in excess of said critical field, the grid being formed of hard superconducting material having a critical field higher than said first mentioned critical field, means including a resistance in series with said grid for electrically coupling said grid in parallel circuit relation with said gate, a source of current, a resistance coupled across the terminals of said source, and an inductance coupling said current source to said cryotron terminals, said inductance having a high A.C. impedance as compared with the impedance of said cryotron.

6. The oscillator according to claim 5 wherein said resistance coupled across said current source and said resistance coupled in series with said cryotron grid comprise second and third cryotrons.

7. The oscillator according to claim 6 wherein said resistance coupled across said current source is effective to provide a D.C. source impedance for securing operation of said negative impedance in its characteristic region of negative impedance.

References Cited by the Examiner

UNITED STATES PATENTS

| | | | |
|---|---|---|---|
| 2,913,881 | 11/1959 | Garwin. | |
| 3,022,468 | 2/1962 | Rosenberger et al. | 331—107 |

ROY LAKE, *Primary Examiner.*

J. B. MULLINS, *Assistant Examiner.*